United States Patent [19]

Arachtingi

[11] Patent Number: 4,601,916

[45] Date of Patent: Jul. 22, 1986

[54] PROCESS FOR BONDING METALS TO ELECTROPHORETICALLY DEPOSITED RESIN COATINGS

[75] Inventor: James J. Arachtingi, Massapequa Park, N.Y.

[73] Assignee: Kollmorgen Technologies Corporation, Dallas, Tex.

[21] Appl. No.: 632,041

[22] Filed: Jul. 18, 1984

[51] Int. Cl.$^4$ ............................................. B05D 5/12
[52] U.S. Cl. ........................................ 427/97; 427/98; 427/435; 438/131; 438/209; 438/901; 204/180.2; 204/181.7
[58] Field of Search ............................ 427/97, 98, 435; 204/181 R, 181 C; 428/131, 209, 901

[56] References Cited

U.S. PATENT DOCUMENTS

| | | | |
|---|---|---|---|
| 3,926,760 | 12/1975 | Allen et al. | 204/181 R |
| 3,936,367 | 2/1976 | Weiss | 204/181 N |
| 4,238,385 | 12/1980 | Okado et al. | 523/443 |
| 4,305,975 | 12/1981 | Ikari et al. | 427/97 |
| 4,321,290 | 3/1982 | Thams | |
| 4,327,126 | 4/1982 | Ogden | 427/98 |
| 4,334,973 | 6/1982 | Carlson et al. | 204/181 R |
| 4,402,998 | 9/1983 | Kumagai et al. | 427/98 |

FOREIGN PATENT DOCUMENTS

| | | | |
|---|---|---|---|
| 2104551 | 8/1972 | Fed. Rep. of Germany | 427/98 |
| 2412733 | 10/1974 | Fed. Rep. of Germany | 427/98 |
| 2811150 | 9/1979 | Fed. Rep. of Germany | |
| 51-49468 | 4/1976 | Japan | |
| 52-35866 | 3/1977 | Japan | 427/97 |
| 80627 | 9/1978 | Japan | |
| 53-111470 | 9/1978 | Japan | |
| 52680 | 1/1980 | Japan | |
| 55-24716 | 7/1980 | Japan | |
| 56-39076 | 9/1981 | Japan | |
| 1343212 | 1/1974 | United Kingdom | 427/98 |

Primary Examiner—Joseph L. Schofer
Assistant Examiner—N. Sarofim
Attorney, Agent, or Firm—Morgan, Finnegan, Pine, Foley & Lee

[57] ABSTRACT

An economical process for producing metal plated through holes in metal core circuit boards which permits the formation of small holes and fine conductor lines is disclosed. A metal sheet, which will become the core of a metal core circuit board, is provided with insulation layers on both sides, and through holes are provided through the insulation layers. The process involves incorporating fillers in a resinous coating solution which is electrophoretically applied to the hole walls to form an insulating layer of uniform thickness thereon. An increased diameter in the metal wall portion of each hole acts to restrict flow of the filled resinous coating solution during cure resulting in a straight hole wall. The coating is adhesion promoted and a metal layer is deposited thereon.

16 Claims, 5 Drawing Figures

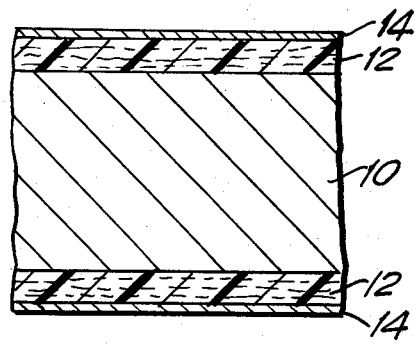
FIG.IA
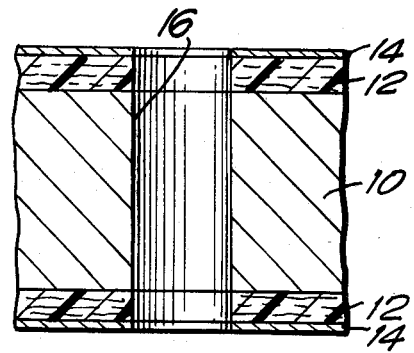
FIG.IB
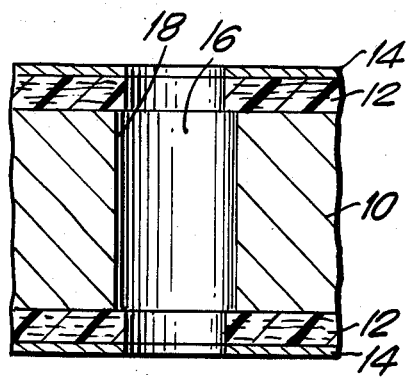
FIG.IC
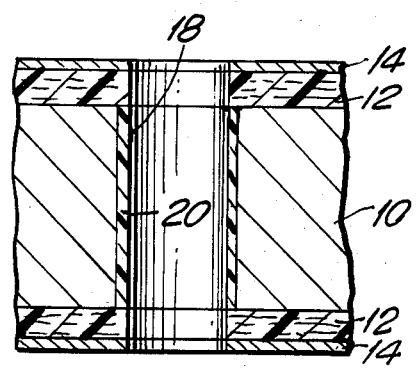
FIG.ID
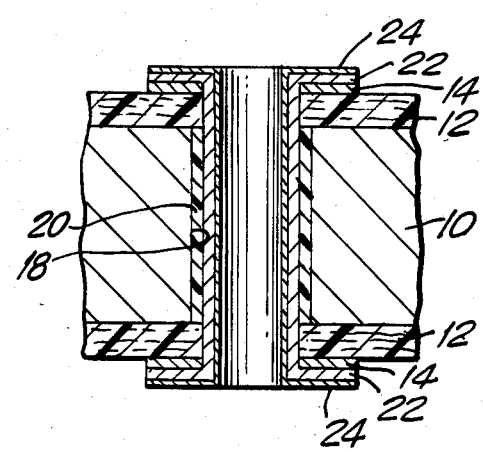
FIG.IE

PROCESS FOR BONDING METALS TO ELECTROPHORETICALLY DEPOSITED RESIN COATINGS

BACKGROUND OF THE INVENTION

1. Field of the Invention

This invention relates generally to an improved process for depositing an adherent metal layer on a substrate having an electrophoretically deposited coating thereon and the article produced thereby. More particularly, this invention relates to metal core printed circuits and a process for producing same.

2. Description of the Prior Art

Metal core substrates used for printed circuits have an insulating layer to insulate individual printed circuit conductors from the metal core. Among the advantages of such metal core substrates are temperature equalization, ground plane shielding, dimensional stability, elimination of warp and high structural strength.

Metal core boards have been used when a heat conductive core is needed to carry heat out of a circuit package. Oversized holes are drilled in a metal core such as aluminum; copper-clad epoxy prepreg is laminated on each side, taking care to fill in the holes completely with epoxy; the holes are redrilled to size; and then the circuit is fabricated by conventional processing including plating through connections by means of the holes in the epoxy plugs.

For example, to produce a plated through hole with a finished diameter of 1 mm, a 1.15 mm diameter hole must be drilled in the epoxy plug to allow for copper plating to a minimum thickness of, e.g., 0.05 mm on the hole walls. Also, an epoxy ring having a minimum thickness of 0.25 mm must remain in the hole to prevent the entire epoxy plug from being torn out of the hole during the second drilling operation. In addition, allowance must be made for cumulative registration errors in the first and second drilling operations by adding another 0.08 to 0.13 mm thickness to the diameter of the original hole to be drilled in the metal substrate. Thus, to produce a finished hole diameter of 1 mm, the original hole in the metal substrate must be drilled to a diameter of 1.73 mm to 1.78 mm. When holes are drilled on 2.54 mm centers, the double drilling operation leaves a web having a width of 0.76 mm to 0.81 mm. The hole to hole distance cannot be made smaller than 2.54 mm because the first hole must be so much larger than the finished hole. This makes it difficult to increase the component packaging density.

The epoxy plugs sometimes are formed by laminating a sheet of copper foil with one or more sheets of glass cloth impregnated with epoxy resin (epoxy prepregs) to one side of the metal substrate. The epoxy resin flows through the holes in the substrate forming the plugs. Then a sheet of copper foil and epoxy prepregs are laminated to the second side of the metal substrate. Lamination employed in this method is a two stage process. If lamination of both sides of the metal substrate occurred simultaneously instead of successively, air would easily be trapped in holes in the metal substrates when both ends of the holes were covered with impervious layers. With the two stage lamination process, it is easier for air bubbles to escape and for a uniform plug of epoxy to fill the holes. In addition, with the two stage lamination process, holes can be inspected after the first stage is completed to ensure uniform filling occurs before further processing continues.

This two stage lamination process has disadvantages. Manufacturing yields are poor. Also, the costs associated with high flow resins, double drilling, double laminating and the problems associated with maintaining tolerances during the double drilling steps are about seven times the cost of a conventional printed circuit board. Therefore, this type of metal core printed circuit board has not found wide acceptance, but has been used for temperature equalization in avionics, where conventional cooling systems are too bulky and ineffective.

Metal core printed circuits also have been manufactured in large quantities utilizing steel substrates having a thickness of 0.5 to 1 mm. Holes for through connections are punched in the steel substrates. Then, the steel substrates are coated by a fluidized bed powder coating process which deposits an insulating layer of epoxy resin in powder form on the substrates and on the walls of the holes therein. However, when the epoxy resin powder on the steel substrate is fused, as is required to cure the coating, the epoxy flows slightly. This creates a thin coating at the top and bottom rims of the holes, and a thick ring of epoxy resin in the center of the holes. To produce an adequate coating thickness at the top and bottom rims of the holes, it is necessary to deposit resin to a thickness of 0.35 mm or more on the surface and in the center of the holes. Thus, 2 mm holes must be formed on 2.54 mm pitch in order to achieve the standard 1 mm hole required for Dual-In-line-Packages. Because only 0.5 mm of the steel substrate remains between the holes, the surface between the holes is rounded, not flat, and it is difficult to print on such surface. This limited the usefulness of the powder coating technique with respect to high density circuit patterns.

Electrophoretically deposited polymers have been widely used as the primer coating on automobile bodies and a variety of appliances. Japanese Patent Publication No. 39076 of 1981 suggests that metal substrates for printed circuits can be insulated with electrophoretically deposited coatings. The coatings flow however, when they are cured, and, as in the case of epoxy powder fluidized bed coatings, this produces a thin coating at the top and bottom rims of the holes and an excessively thick coating in the center. The process therefore has not been successful in making a commercially useful product.

Japanese Patent Publication No. 51-49468 of 1976; Japanese Patent Publication No. 53-111470 of 1978; Japanese Patent Publication No. 55-24716 of 1980; and U.S. Pat. No. 4,321,290 disclose that a truly cylindrical surface in the holes can be achieved by first coating the surfaces of a metal substrate with an insulating layer of uniform thickness before producing holes for through connections; after the holes are made, the metal walls of the holes are etched back creating an overhang or lip of the insulating layer at the top and bottom of the holes walls. Then, a resin is electrophoretically deposited on the metal walls of the holes creating a uniform film of resin on the hole walls without producing thinning of the coating at the top and bottom rims of the holes, or a thick ring at the center.

In practice, it has been found that the known resin systems for electrophoretic depositions are not a suitable base for the metallized through hole walls required in the printed circuit art. Despite large investments of manpower and research efforts by major manufacturers of electronic equipment for the computer and telecommunications industries, attempts to practice these inventions therefore were unsuccessful. It was found that copper deposits would not adhere to the hole walls and further that the electrical insulating properties are inadequate. For these reasons, the teachings of U.S. Pat. No. 4,321,290, Japanese Patent Publication No. 51-49468 of 1976, Japanese Patent Publication No. 53-111470 of 1978, and Japanese Patent Publication No. 55-24716 of 1980 have not found commercial application.

SUMMARY OF THE INVENTION

1. Objects of the Invention

It is an object of this invention to provide an improved process for making printed circuits on a metal substrate.

It also is an object of this invention to provide an improved process for making plated through holes in metal core printed circuit boards.

An additional object of this invention is to provide a process for depositing adherent metal on electrophoretically coated substrates.

A further object of this invention is to provide electrophoretically deposited coatings which possess good insulating properties and are capable of being adhesion promoted.

Other objects and advantages of the invention will be set forth in part herein and in part will be obvious herefrom or may be learned by practice with the invention, the same being realized and attained by means of the instrumentalities and combinations pointed out in the appended claims.

2. Brief Description of the Invention

Applicant has found that adhesion of a metal layer on an electrophoretically deposited resin coating is improved by incorporating solid fillers in finely divided form in the electrophoretically deposited coating, curing and then adhesion promoting a surface of the coating to expose filler particles at the surface of the coating and depositing a metal layer on the surface of the coating.

In one aspect, this invention relates to an improvement in a process for producing a printed circuit on an insulated metal substrate comprised of a metal core with insulating surface layers in which the substrate is provided with holes for through connections and metal wall portions of the holes are insulated with a resinous coating electrophoretically deposited from a solution thereof, the solution comprising a synthetic resin such as a thermosetting resin and/or a thermoplastic resin, the improvement comprising:

incorporating in the resin solution a solid filler in finely divided form, said filler being non-resinous, inorganic, non-reactive with the solution and uniformly dispersed therethrough, said filler being capable of improving the adhesion of a metal layer to the electrophoretically deposited resinous coating after the coating is adhesion promoted, the resinous coating containing the filler having a volume resistivity greater than $10^4$ megohm-cm between the printed circuit conductor and the metal core;

electrophoretically depositing the resinous coating and filler from the solution onto the metal wall portions of the holes, the deposited coating having filler dispersed therethrough;

curing the resinous coating;

adhesion promoting the surface of the resinous coating to create a hydrophilic, microetched surface on the coating;

depositing a metal layer on the surface of the resinous coating on the hole walls, and on the insulating surface layers, the metal layer deposited on the microetched surface of the resinous coating being continuous, free of blisters, and preferably adhering to the coating with a peel strength of at least 0.1 N/mm, and forming said printed circuit on the insulated metal substrate.

This invention also relates to an improvement in a process for producing a printed circuit on an insulated metal substrate comprised of a metal sheet with insulating surface layers in which the substrate is provided with holes for through connections and metal wall portions of the holes are insulated with a resinous coating electrophoretically deposited from a solution thereof, the solution comprising an epoxy resin, the improvement comprising:

incorporating in the resin solution a solid filler in particulate form, the average particle size of which is finer than about 10 microns in diameter, the filler being non-resinous, inorganic, non-reactive with the solution and uniformly dispersed therethrough, the filler being capable of improving the adhesion of a metal layer to the electrophoretically deposited resinous coating after the coating is adhesion promoted, the filler comprising from about 1% to about 25% by weight of the cured resinous coating and being selected from the group consisting of clays, silica, alumina, silicates, earths, barium sulfate, zinc oxide and titanium dioxide, the resinous coating containing the filler having a volume resistivity greater than $10^4$ megohm-cm between the printed circuit conductor and the metal sheet;

electrophoretically depositing the resinous coating and filler from the solution onto the metal wall portions of the holes, the deposited coating having filler dispersed therein;

curing the resinous coating, the thickness of the coating after curing being at least 0.025 mm;

adhesion promoting the surface of the resinous coating with an aqueous oxdizing solution to creat a hydrophilic, microetched surface on the coating;

depositing a metal layer on the surface of the resinous coating on the hole walls, and on the insulating surface layers, the metal layer deposited on the microetched surface of the resinous coating being continuous, free of blisters and preferably adhering to the coating with a peel strength of at least 0.1 N/mm, and forming said printed circuit on the insulated metal substrate by standard printed circuit techniques.

In another aspect, this invention relates to an improvement in a process for producing a printed circuit on an insulated metal substrate, which process includes providing one or more insulating layers on surfaces of a metal sheet to form the insulated metal substrate; providing one or more holes through the insulated substrate for through connections; etching the holes walls defined by the metal sheet to enlarge by a predetermined amount only the portion of the holes extending through the metal sheet, electrophoretically depositing a resinous coating comprising a thermosetting resin from a solution thereof on the etched back portion of the hole walls; curing the resinous coating; and forming the printed circuit on the surface of the insulating layers and on the walls of the holes; the improvement which comprises:

incorporating in the resin solution a solid filler in finely divided form, the filler being non-resinous, inorganic, non-reactive with the solution and uniformly dispersed therethrough, the filler being capable of improving the adhesion of a metal layer to the electrophoretically deposited resinous coating after the coating is adhesion promoted, the resinous coating containing the filler having a volume resistivity greater than $10^4$ megohm-cm between the printed circuit conductor and the metal sheet;

electrophoretically depositing the resinous coating and the filler from the solution onto the metal wall portions of the holes, the deposited coating having fillers dispersed therethrough;

curing the resinous coating;

adhesion promoting the surface of the resinous coating containing the filler to create a hydrophilic, microetched surface on the coating;

depositing a metal layer on the surface of the resinous coating on the hole walls, and on the insulating layers, the metal layer deposited on the microetched surface of the resinous coating being continuous, free of blisters and preferably adhering to the coating with a peel strength of at least 0.1 N/mm., and forming said printed circuit on the insulated metal substrate.

This invention also relates to a printed circuit article comprising:
(a) a metal core;
(b) insulating layers superimposed on the surfaces of the metal core;
(c) at least one hole through the insulating layers and the metal core, the hole diameter defined by the metal core being greater than the hole diameter defined by the insulating layer;
(d) the metal walls of said hole being coated with an electrophoretically deposited resinous coating, said resinous coating comprising a thermosetting resin and an insulating filler, the filler being dispersed therein;
(e) a metal conductor pattern adhered with a peel strength of at least 0.1 N/mm on the surface of the insulating layer, on the surface of the resinous coating and on the hole walls, the metal conductor pattern being continuous and free of blisters, the resistance between the metal conductor pattern and the metal core preferably being greater than 1 gigaohms and more preferable being greater than about 10 gigaohms.

In another aspect, this invention relates to a process for depositing an adherent metallic film on at least part of a surface coated with an electrophoretically deposited resinous coating, the resinous coating including a thermosetting resin, the process comprising:
(a) incorporating in the resinous coating a filler in finely divided form selected from the group consisting of clays, alumina, silica, silicates, earths, barium sulfate, zinc oxide and titanium dioxide;
(b) electrophoretically depositing the resinous coating onto the surface of a metal substrate;
(c) curing said resinous coating;
(d) adhesion promoting the surface of said resinous coating to expose some of the filler and to create a microporous, hydrophilic surface on at least part of the coating; and
(e) electrolessly depositing an adherent metallic film on the part of the surface which had been adhesion promoted, the metal film deposited being continous, free of blisters and adhering to the resinous coating when tested with a pressure-sensitive tape.

In still another aspect, this invention relates to an article having a surface suitable for receiving an adherent layer of metal by electroless deposition, at least part of said surface comprising a cured, electrophoretically deposited, thermosetting resin coating, said resin coating containing a filler in finely divided form selected from the group consisting of clays, alumina, silica, silicates, earths, barium sulfate, zinc oxide and titanium dioxide, the surface of said resinous coating being microporous and hydrophilic, some of said filler particles being exposed at the surface of said resinous coating.

3. Detailed Description Of The Invention

In the process for carrying out this invention, a sheet of metal is provided on both surfaces with an insulating coating. Copper foil optionally may be provided on the insulating coating. Holes are made through copper cladding, if present, the insulating coatings and the metal substrate at preselected points where through connections will be needed for the printed circuit. The exposed metal substrate on the walls of the holes is etched back to provide an overhang of insulation at the top and bottom walls of the holes. The metal sheet then is immersed in a resin dispersion and an insulating resin layer is electrophoretically deposited on the walls of the holes.

The resin dispersion contains a solid filler in finely divided form and in an amount sufficient to subsequently provide adhesion for the metallic layer, but insufficient to adversely affect the mechanical or insulating qualities of the final insulation layer. The filler must be compatible with the dispersed resin system. Thus, in acidic cationic systems, no carbonates can be used, i.e., calcium carbonate is a suitable filler for anodic, but not cathodic coatings. Salts and other impurities should be kept to a minimum in all parts of the system. The filler codeposits with the resin on the hole walls.

The insulating layer on the hole walls is fused and cured by heat. After the insulating layer is cured, its surface is adhesion promoted in order to receive an adherent deposit of metal to form the plating in the through-holes. A printed circuit conductor network is imposed on the insulating coating covering the outer surfaces of the metal sheet. This printed circuit network is connected from one side of the metal substrate to the other by means of the metal deposits on the insulating layer in the holes. The printed circuit conductors on the outer surfaces may be established before, simultaneously with, or after the holes are metallized, depending on the printed circuit manufacturing method selected.

The metal substrate used as a carrier for a printed circuit conductor network performs the functions of supporting the printed circuit, and providing the necessary form, flatness and rigidity as may be required. The metal substrate also may provide additional functions such as heat sinking or thermal control, controlled impedence for microstrip designs, and shielding for electromagnetic interference.

The metal of the substrate is usually in sheet form, and can be of various thicknesses depending upon the application. Where some flexibility is required in the final printed circuit package, the metal substrate can be as thin as 0.1 mm; and where heavy components such as transformers are to be supported on the printed circuit package, it can be as thick as 3 mm or more. However, in most applications, the preferred thickness is 0.5 to 1.3 mm. The choice of metal also depends on the application. Steel often is preferred for economy. For many applications where weight is an important factor, aluminum is used. Aluminum also is a better heat conductor than steel, and is easier to fabricate. Some printed circuits require a substrate with the same coefficient of thermal expansion as ceramic circuit packages. For these applications, special alloys, such as copper clad Invar, an iron-nickel alloy containing 36% nickel (commercially available from Texas Instruments Inc., Metallurgical Div., Attleboro, Mass. 02703), and Alloy 42, an iron-nickel alloy containing 42% nickel (commercially available from Pfizer, Inc., Wallingford, Conn.), are preferred.

The metal sheet is coated on both sides with an insulating layer. Many coating processes may be used, including those used in the metal coil coating industry, which would be particularly suitable for large volume applications. Another process for applying an insulating layer is lamination, e.g., one or more sheets of glass cloth impregnated with epoxy resin (epoxy prepreg) or other suitable materials can be laminated by heat and pressure or attached by other known processes to each side of the metal sheet. Optionally, copper clad prepregs may be laminated to the metal core sheet to provide copper foil surfaces insulated from, and supported on, a metal substrate.

Other processes for applying insulating layers to the surfaces of metal sheets include spray painting, electrostatic powder spraying, electrophoretic coating and the like. Electrophoretic coating is particularly convenient. The insulating layers may be applied to the metal sheet using the same electrophoretic formulation which is used in coating the holes.

After the insulating layer on the metal sheet has been cured or otherwise affixed, the holes for through connections are made through the insulating layers and the metal sheet. Exposed metal on the hole walls is etched back slightly. Then, an insulating resinous coating is electrophoretically deposited on the exposed metal of the hole walls and a printed circuit conductor pattern is applied. The conductor pattern may be formed by either the additive or semi-additive technique or in the case of a copper clad insulated metal substrate, by any other known process.

The resins used for the electrophoretically deposited resinous coating must have good insulating properties, and sufficient thermal stability to withstand the soldering temperatures to which printed circuits are subjected. Typically, printed circuits are tested at solder temperatures of 288° C., but in some manually soldered printed circuits, soldering temperatures may reach 425° C. for a short time at the contact point of the soldering iron. In addition to having good insulating and thermal properties, the resin system must be able to achieve a polar surface suitable for metallization, i.e., it should be adhesion promotable. Suitable resins for this invention include thermosetting resins selected from acrylics, alkyds, epoxies, epoxy-acrylates, polyesters, polyamide-imides, polyimides and mixtures thereof. It is believed that suitable resins for this invention also include thermoplastics resins such as acrylates, polysulfones, polyetherether ketones, or other engineering grade thermoplastics, and mixtures of the foregoing resins.

Included among the electrophoretically deposited coatings suitable for insulating walls of holes in metal substrates according to this invention are the autophoretically deposited or autodeposition coatings. In the autophoretic process, the coating is deposited by chemical precipitation from a resin emulsion containing a synthetic polymer. In one system, the resin emulsion contains a synthetic polymer, hydrogen fluoride and an oxidant, e.g., hydrogen peroxide. The hydrogen fluoride and the oxidant oxidize the iron of the metallic substrate to ferric ions. The ferric ions react with the resin emulsion causing destabilization and deposition of the resin as a film on the steel substrate. After deposition, the film is cured.

Adhesion promotion of cured resin surfaces is usually a chemical or combined chemical and elecrical treatment. The adhesion promotion treatment typically makes the cured resin surface microporous, polar and hydrophilic. Hydrophilic surfaces are required for metallization from aqueous solutions. For non-aqueous metallization, e.g., vacuum sputtering, a polar, but not necessarily a hydrophilic, surface is required for good adhesion.

Adhesion promotion systems, per se, are well known in the printed circuit and plating-on-plastics arts. Among the adhesion promotion systems are aqueous oxidizing solutions such as permanganate solutions, chromic acid solutions, blends of chromic and sulfuric acids, or of chromic acid, sulfuric acid and phosphoric acid and the like. The so called "swell and etch" procedure, wherein the article to be adhesion promoted first imbibes an organic solvent, and then is oxidized in an appropriate oxidizing solution, also has been used successfully in the context of the present invention. Adhesion promotion also can be achieved by corona discharge, or by the plasma technique wherein the composition of the gas comprising the plasma is selected according to the surface to be adhesion promoted.

It has been found that prior art electrophoretically deposited coatings cannot be adequately adhesion promoted. The cured electrophoretically deposited coatings do not provide adequate adhesion if exposed to the milder adhesion promotion techniques, and such coatings are so thin that the more severe adhesion promotion destroys the bond of the coating to the metal substrate, or the coating itself. It was found that electrophoretically deposited coatings less than 12 micrometers thick are usually too thin to be adhesion promoted successfully.

If there are asperities or small projections of metal left when the walls of the holes are etched back before the electrophoretically deposited coating is applied, coatings with thicknesses, before adhesion promotion, in the range of 18 to 20 micrometers often are not thick enough. The electrophoretically deposited coating flows when cured and leaves a thinner coating over the asperities. When such a thin coating is adhesion promoted, the asperity is exposed. Copper or other metal deposited on the hole wall then will create a short circuit through the asperity to the metal substrate. The number or height of asperities or projections depends on the alloy used for the substrate and the etching solution or technique employed to etch back the hole walls.

Even with an electrophoretically deposited coating thickness of only 25 micrometers in the hole, a short circuit to the metal substrate may occur. More reliable insulation is obtained when the coating thickness before adhesion promotion is in excess of 25 micrometers, preferably 30 micrometers, and most preferably 35 micrometers or greater.

Prior art coatings were not able to provide a suitable base for metallization. As a result, prior art metallization layers were incomplete, with voids in the metal layer due to poor adhesion of the catalyst or of the initial metal deposit, or the metal layer was poorly adhered and blistered or flaked off.

Surprisingly, it has been found that the addition of certain solid, particulate fillers to the electrophoretically deposited resin system makes possible adhesion of metallization layers to the hole walls, i.e., the electrophoretically deposited coatings.

Although adhesion promotion of unfilled coatings can provide a hydrophilic surface, adequate adhesion has not been obtained. It is believed that adhesion promotion of filled coatings exposes filler particles and provides a microporous, hydrophilic surface for stronger bonds to the metal layer.

Suitable fillers for applicant's invention are: (1) suspendable in the electrophoretic dispersion solution; (2) capable of being co-deposited with the electrophoretic resin; (3) compatible with subsequent processing; and (4) good reinforcement for the resin system. The fillers also should have good insulating properties, or, if not good insulators, be present in such quantities as to avoid detrimentally affecting the insulating capabilities of the filled resin dielectric layer.

The concentration of filler in the resinous coating is selected so that the volume resistivity of the coating remains above the minimum necessary to adequately insulate the metal core and the deposited metal layer, i.e., above about $10^4$ megohm-cm, preferably above about $10^5$ megohm-cm. Non-conductive fillers meeting the above criteria are suitable for this invention. Fillers which are conductive, however, also are contemplated within the scope of this invention, provided that their presence does not reduce the volume resistivity below $10^4$ megohm-cm.

Suitable fillers according to applicant's invention include clays such as kaolin, attapulgites, montmorillionites and the like; modified clays such as the amine bentonites; inorganic filler and reinforcing agents such as barium sulfate, zinc oxide and titanium dioxide. In addition, alumina and silica are suitable, including fumed silicas such as Cab-o-Sil ® (commercially available from the Cabot Corp.) and Santocel ® (commercial available from the Monsanto Co.); also silicates such as talcs and aluminum silicates, and earths such as diatomaceous earths, Panamint earth (silicon 21-35%, aluminum 15-28%, calcium 2-3%, iron 1-2%, magnesium, sodium, potassium, lithium, strontium and copper less than 2%), and the like.

The fillers are in particulate form. The preferred fillers have an average particle size of 5 micrometers or less and less than 0.5% of the filler particles are retained on an ASTM 325 mesh screen (44 micrometers). More preferred fillers have an average particle size of 1 micron of less, and less than 0.1% of the filler particles are retained on an ASTM 325 mesh screen.

The filler selected, when incorporated in the electrophoretically deposited coating, must provide, after adhesion promotion, sufficient adhesion of the metal film to the electrophoretically deposited coating. For plated holes, the metal film should adhere to the electrophoretically deposited coating. Such film adhesion may be tested on test plaques and should pass a "tape test", i.e., resist separation when tested with pressure sensitive tape (at least 0.1 N/mm). Adhesion of the metal film to the electrophoretically deposited coating should be high enough to ensure that there are no blisters formed between the metal and the coating on test plaques or in the holes. If the electrophoretically deposited coating containing the filler is used as the surface insulation layer for the metal sheet as well as the insulation in the holes, the bond strength of the metal film to the adhesion promoted coating should be 5-10 N/mm.

In general, conductive fillers such as carbons are not suitable for the purposes of this invention because they tend to reduce the insulating properties of the electrophoretically deposited coatings to unacceptable values. Very low levels of certain carbon fillers are compatible with acceptable insulating properties, but higher carbon loadings are to be avoided.

Acceptable combinations of resin and filler in an electrophoretically deposited coating, after curing, exhibit a dielectric breakdown voltage of at least 1000 volts. Dielectric breakdown voltages of at least 2500 volts are preferred and more preferred are cured coating combinations with a dielectric breakdown voltage of over 5000 volts.

The layer of coating electrophoretically deposited on the hole walls must be thick enough to provide adequate insulation between the metal which is plated over the coating and the base metal substrate. To obtain thicker electrophoretically deposited coatings, the temperature of the coating solution may be increased, more solvent may be added to the electrophoretic resin system, a higher deposition voltage may be used, a voltage may be applied in a sequence which increases the voltage and thicknes with time, or a combination of these techniques may be used. The preferred thickness is less than 0.055 mm after curing and before adhesion promotion. When the filled resinous coating layer is too thick, it tends to flow during the cure. Thus, the resinous coating solution deposited on the walls of the hole is no longer uniform, but is thicker on one area of the hole wall and thinner on another.

The electrophoretic resin system may be either anodic or cathodic, i.e., the metal substrate to be coated may be used as either the anode or the cathode in the electrophoretic deposition system. When the metal substrate is the anode, the electrophoretic resin dispersion must carry the opposite charge, i.e., negative, and if it is the cathode, the electrophoretic resin dispersion must be formulated to carry a positive charge. With anodic systems there is a slight possibility that the metal ions may be anodically dissolved from the substrate and incorporated in the coating, thereby reducing the electrical insulating properties. For this reason, although most anodic coatings are effective insulators, cathodic coatings are preferred.

The printed circuit pattern may be applied to the exterior insulated surface of the substrate by any conventional printed circuit technique, i.e., subtractive, semi-additive, additive or even discrete wiring techniques. The printed circuit pattern can be formed either before or after forming the holes in the metal substrate and before or after insulating the hole walls.

A conventional technique for manufacturing printed circuits include the steps listed below:

1. After the holes have been coated and adhesion promoted, a copper clad substrate is immersed in a cleaner/conditioner solution to prepare for through-hole plating. Cleaner/conditioner solutions are well known in the art and are used to remove light oils, fingerprints, and other surface contaminants from the copper foil, and to condition the holes for activation and electroless copper plating. Typical cleaner/conditioner solutions include those described in U.S. Pat. No. 3,563,784 to W. Innes et al. and U.S. Pat. No. 3,684,572 to K. Taylor as well as those commercially available as Metex PTH Cleaner 9076TM from MacDermid Inc., Waterbury, Conn.; Cleaner/Conditioner 1175A TM from Shipley Co. Inc., Newton, Mass.; Sir-Cuit 4318BS Cleaner/Conditioner from Luster-On Products, Inc., Springfield, Mass.; and GC-120 Cleaner/Conditioner from PCK Technology Div., Kollmorgen Corp., Melville, N.Y.
2. The copper clad substrate is rinsed and copper foils on the surface are microetched with persulfate or acidic peroxide solution.
3. The copper clad substrate is rinsed and dipped in a 20% sulfuric acid solution.
4. The copper clad substrate is rinsed and dipped in an activator predip. Activator predips are well known to those in the art and typically comprise sodium chloride brines with a low pH and frequently contain stannous chloride. Activator predips which are commercially available include LA-240 Predip TM from PCK Technology Div. of Kollmorgen Corp.; PTH Predip 9008 TM from MacDermid Inc., and Cataprep 404TM from Shipley Co.
5. From the predip solution, the copper clad substrate is next immersed in an activator solution. Typical activator solutions are described in U.S. Pat. Nos. 3,672,938; 3,682,671; and 3,672,923, all to R. Zeblisky and U.S. Pat. No. 3,961,109 to R. Kremer et al. Usually the activator solution comprises an acid solution of a palladium-tin chloride complex dissolved in a 2 to 4 molar sodium chloride brine.
6. After rinsing, the copper clad substrate is immersed in an accelerator solution. Suitable accelerator solutions include dilute fluoroboric acid solutions and ammonium fluoride solutions.
7. After rinsing, copper is electrolessly deposited on the copper foil surface and on the hole walls. Then a printed circuit resist image is formed, usually by depositing a negative electroplating resist pattern on the surface and electroplating copper and tin-lead on the positive circuit pattern and through the holes. After removing the negative resist, all the copper in the background not covered by tin lead is removed by etching.

This invention is more fully described hereinafter with reference to the accompanying drawings which illustrate certain embodiments of this invention and together with the specification serve to explain the principles of the invention.

DESCRIPTION OF THE DRAWINGS

FIG. 1 illustrates a procedure suitable for the manufacture of printed circuit boards from insulated metal substrates.

FIG. 1A is a side view in cross-section of a metal substrate with an epoxy impregnated glass cloth insulation inner layer and a copper foil outer layer on each side of the substrate.

FIG. 1B is a side view in cross-section of the metal substrate and its covering layers with a hole drilled therethrough.

FIG. 1C is a side view in cross-section of the metal substrate in which the walls of the hole have been etched to enlarge the diameter.

FIG. 1D is a side view in cross-section of the metal substrate in which a coating has been electrophoretically deposited on the hole walls.

FIG. 1E shows a side view in cross-section of the metal substrate with a completed plated through hole.

A process for carring out the invention using the subtractive technique of manufacturing printed circuits is illustrated in the drawings. Referring to FIG. 1A, a metal core sheet 10 is laminated with epoxy prepregs 12 and copper foil cladding 14 on both surfaces. Next in FIG. 1B, holes 16 for through connections are drilled through the copper surface foils 14, the epoxy glass cloth insulation 12 and the metal core 10. As shown in FIG. 1C, the wall 18 of the metal core 10 defining the holes 16 is etched back 25-100 micrometers.

The etchant used to etch the metal core should not attack the surface copper foils so severely that it removes the copper; thus an aluminum metal core with copper foils as its surface could be etched by a sodium hydroxide solution. If it is necessary to use an etchant that will attack the surface copper foils, the foils should be protected with a resist during the etching process. Alternately, the metal core may be etched electrolytically by making the metal core an anode in a suitable electrolyte.

After the metal core 10 has been etched back, the part is immersed in a resinous coating solution, and a voltage (typically 100-300 volts) is applied to electrophoretically deposit the coating. Voltage is applied only to the metal core 10 and not to the surface copper foils 14, so that the resinous coating is electrophoretically deposited only on the walls of the holes in the metal core and not on the surface copper foils. After electrophoretic deposition, the part is rinsed to remove excess electrophoretically deposited resin dispersion, and the electrophoretically deposited coating first is dried, and then is cured by heat.

FIG. 1D shows the electrophoretically deposited coating 20, after it has been fused, filling the etched back portion of the hole wall 18 in the metal substrate 10. The coating 20 on the walls of the metal core is adhesion promoted to microetch the surface of the coating in the holes and render the surface hydrophilic. Electroless copper then is deposited on the part by conventional techniques. The copper film in the holes is reinforced with an additional metal deposit. A printed circuit conductor pattern is printed on the surface copper foils, and the interconnection between the two surface copper circuit patterns is reinforced by plating additional metal on the surface conductor pattern and on the copper film in the through holes.

FIG. 1E illustrates the finished plated through hole, wherein the electrophoretically deposited coating 20 is overlaid with a layer of electrodeposited copper 22 and a tin-lead electrodeposit 24. The tin-lead electrodeposit 24 is used as an etch resist over the printed circuit pattern when the unwanted portions of the copper foil 14 are etched away.

A semi-additive process follows the same procedure except that instead of surface copper foils, surfaces are provided which can be adhesion promoted. Thus, when the through holes receive an electroless metal film, the adhesion promoted surfaces also receive a film of electroless metal. Then, resist images outlining the conductor pattern may be provided on the top and bottom surfaces, and the conductor pattern reinforced by electroplating simultaneously in the holes and on the surface.

An additive process is similar to the semi-additive procedure except that the resist image on the adhesion promotable surface may be applied before adhesion promotion. The total conductor pattern on the surfaces and in the through holes then is applied by electroless metal deposition.

EXAMPLE 1

Resinous coatings were electrophoretically deposited on the surface of aluminum plaques in order to test the adhesion of electroless metal deposits to the electrophoretically deposited coatings.

Surface Preparation

The aluminum surface was prepared for electrophoretic deposition by: solvent degreasing, a mild alkaline etch, a rinse, and an acid dip.

Electrophoretic Solution Make-up

|  | Unfilled | Filled |
|---|---|---|
| resin K5276A* | 560.0 g | 132 g |
| resin K5268** | 55.8 g | 13 g |
| lactic acid | 19.8 ml | 4.9 ml |
| phosphoric acid | 7.3 ml | 1.7 ml |
| defoamer*** | — | 0.1 g |
| filler**** | — | 5.9 g |
| deionized water | 3357.1 ml | 842.4 ml |

*A cathodic epoxy-amino resin in 23% ethylene glycol monobutyl ether and 6% ethylene glycol monohexyl ether, commercially available from the Glidden Coatings and Resin Division of SCM Corp.
**A cathodic epoxy resin with hardener in 38% ethylene glycol monobutyl ether, commercially available from the Glidden Coatings and Resin Division of SCM Corp.
***Tetramethyl decynediol commercially available from Air Products and Chemicals Corp., Allentown, Pa as Surfonyl 104.

An unfilled resinous coating according to the prior art was used as a control. The filled resinous coating had a filler-to-resin ratio of 1 to 16.

Resinous Coating Application

The resinous coatings were electrophoretically deposited cathodically from agitated solutions in stainless steel tanks. The stainless steel solution tanks acted as the anode. The temperature of the deposition solution was 24.5° C. The coating was applied at 125 volts for 2 minutes. After rinsing and air drying, the coatings were cured at 175° C. for 40 minutes.

Adhesion Promotion

The resin coated aluminum plaques were immersed for three minutes at 45° C. in the following acid solution:

| chromium trioxide | 20 g |
|---|---|
| sulfuric acid | 600 ml |
| phosphoric acid | 100 ml |
| deionized water | 300 ml |
| wetting agent | 2 g |

They were rinsed, then immersed in an oxidizing solution:

| chromium trioxide | 900 g/l |
|---|---|
| time | 8 minutes |
| temperature | Room |

After neutralization in sodium metabisulfite solution and rinsing, the plaques were ready for electroless metallization.

Metal Deposition

A standard electroless copper metallization was carried out by procedures well known in the art.

The plaques were immersed in an aqueous cleaner-conditioner solution (commercially available as GC-120 from PCK Technology Division Melville, New York 11747) for 5 minutes at 60° C.; rinsed in cold water for 5 minutes; immersed for 3 minutes at ambient temperature in an acidic solution of tin chloride dissolved in a sodium chloride brine; immersed for 5 minutes at 30° C. in a palladium-tin chloride activator solution; rinsed in cold water for 5 minutes; immersed for 4 minutes at ambient temperature in dilute fluoroboric acid solution; rinsed in cold water for 5 minutes; and immersed for 20 minutes at 50° C. in an electroless copper deposition solution comprising:

| copper sulfate pentahydrate | 12 g/l |
|---|---|
| ethylenediamine tetra-2-propanol | 15.4 g/l |
| alkylphenoxypolyglycidyl-phosphate ester | 0.16 g/l |
| sodium cyanide | 10 mg/l |
| potassium sulfide | 1 mg/l |
| 2-mercaptobenzothiazole | 0.1 mg/l |
| formaldehyde (37%) | 3.5 ml/l |
| sodium hydroxide | 8.4 g/l |

Results

The filled resinous coating displayed a smooth, faultless, blister-free deposit of copper on the surface of the coating. The copper was not removed by mild abrasion, or by a tape test with a pressure sensitive adhesive coated cellophane tape.

On the unfilled resinous coating prepared according to the prior art, copper blistered off in the electroless solution.

EXAMPLE 2

Aluminum plaques were prepared as in Example 1. The amount of filler in the electrophoretic solution was varied. Electrophoretic Solution Make-up

|  | filler to resin ratio | | |
|---|---|---|---|
|  | 1:4 | 1:32 | 1:64 |
| resin K5276A | 41.6 g | 198 g | 136 g |
| resin K5268 | 7.7 g | 19.5 g | 13.4 g |
| phosphoric acid | 0.5 ml | 2.55 ml | 1.7 g |
| lactic acid | 1.9 ml | 7.4 ml | 4.9 ml |
| defoamer*** | 0.1 g | 0.14 g | 0.02 g |
| filler**** | 8.0 g | 8.8 g | 1.47 g |
| deionized water | 340 ml | 762.5 ml | 843.5 ml |

Application of the resinous coating, adhesion promotion, and metal deposition were as in Example 1. The results obtained were the same as Example 1. Deposited copper on each filled resinous coating exhibited complete adhesion, i.e., the copper did not blister or separate from the resinous coating in a tape test.

EXAMPLE 3

Surface preparation of the plaques, the electrophoretic solutions, and application of the resinous coatings were as in Example 1. Alternate adhesion promotion systems were tested.

Adhesion Promotion

The following solutions were used in place of the first acid solution in the Adhesion Promotion step of Example 1:

| | | |
|---|---|---|
| (1) | phosphoric acid | 50 ml/l |
| | An anionic fluorocarbon wetting Agent (commercially available as FC-98 from 3M Company) | 2 g/l |
| | time | 1-15 minutes |
| | temperature | 25° C. |
| (2) | sulfuric acid | 10% solution |
| | time | 1-15 minutes |
| | temperature | 25-45° C. |
| (3) | sulfuric acid | 600 ml |
| | phosphoric acid | 100 ml |
| | deionized water | 300 ml |
| | An anionic fluorocarbon wetting Agent (FC-98) | 1-2 g |
| | time | 15 sec.-15 min. |
| | temperature | 25-55° C. |

With the exception of #2, these solutions were followed by a running rinse before inserting the plaques into the oxidizing solution.

In addition to the oxidizing solution in Example 1, the following was used:

| | |
|---|---|
| chromium trioxide | 400 g |
| phosphoric acid | 50 ml |
| sulfuric acid | 200 ml |
| deionized water | 700 ml |
| An anionic fluorocarbon wetting Agent (FC-98) | 2 g |
| temperature | 25-65° C. |
| time | 2-20 minutes |

Neutralization again was in solutions of sodium metabisulfite.

Metal deposition was accomplished as in Example 1. The results were again the same. Complete adhesion of copper was found only on the resinous coating which contained the filler.

EXAMPLE 4

A printed circuit board was produced by laminating on both sides of a 1 mm sheet of aluminum with 0.2 mm of epoxy prepreg and with copper foil. The panel was drilled and the aluminum surfaces thus exposed were etched to increase the radius of the hole 25-35 micrometers by immersion in an aqueous 15% sodium hydroxide solution. The portion of the aluminum based exposed in the drilled holes was coated with the electrophoretically deposited, filled, resinous coatings of Example 1. The panel was rinsed and heated in an oven at 175° C. for 30 minutes. All exposed aluminum surfaces were covered with a pore free, resinous coating.

The panel was adhesion promoted by the procedure of Example 3 above, using first the #3 acid solution at 45° C. and then the oxidizing solution of Example 1. It then was plated with electroless copper by the procedure of Example 1. The printed circuit pattern was outlined with a resist image leaving the desired conductor pattern and the holes exposed. Copper, 25 micrometers thick, was electroplated onto the conductor pattern and through the holes. Then 7 micrometers of tin-lead was overplated on the copper as an etch resist. The resist image outlining the conductor pattern was removed and the background copper, which had been under the resist, was etched away.

The completed printed circuit board was tested by floating the circuit board in molten solder at 288° C. There was no blistering or delamination of either the surface conductors or the plating in the holes. The resistance between the conductor pattern and the aluminum core was greater than $10^{10}$ ohms.

The group of plated through holes were cut from the printed circuit and examined by microsectioning techniques. The copper plating on walls of the hole was complete and uniformly adhered to the electrophoretically deposited coating. The copper plating contained no voids and completely covered the electrophoretically deposited coating in the holes.

The procedure was repeated using the unfilled prior art resinous coating of Example 1. Blisters on the hole walls were observed in the electroless copper deposit. The completed printed circuit was tested by floating the circuit board on molten solder at 288° C. for 10 seconds. The circuit board failed the solder float test due to separation of the copper deposit from the hole walls.

EXAMPLE 5

Copper foil and a 0.2 mm epoxy prepreg insulating layer were laminated to both sides of an aluminum sheet. Holes 1 mm in diameter, were drilled as required for the desired printed circuit board. The panel was immersed in a 20% solution of sodium hydroxide at 23° C. for 40 minutes. This produced a uniform etch back of the aluminum hole walls of 0.03 mm.

For comparison purposes, a carbon filled epoxy resin coating (commercially available as ED-3002 from PPG Industries Inc.) was used to coat the holes. This is a cathodic electrophoretic resin coating. The coating was applied at 175 volts for 100 seconds and cured at 175° C. for 20 minutes. The cured coating in the holes was 18 micrometers thick.

In order to adhesion promote the cured resinous coating in the holes, the sheet was immersed in a solution of 50% isopropanol and 50% dimethylforamide at room temperature for 8 minutes. It then was blown dry with an air jet and immersed in the oxidizing solution of Example 1 for 3 minutes, rinsed and neutralized in a sodium metabisulfite solution.

The sheet then was prepared for electroless copper plating by conventional techniques and plated in an electroless copper plating solution, operated at room temperature, of the formula:

| | |
|---|---|
| copper sulfate | 9 g/l |
| ethylene diamine tetrapropanol | 17 g/l |
| surfactant, a block copolymer of ethylene oxide and propylene oxide, commercially availabl as Pluronic P85 from BASF-Wyandotte Corp., Wyandotte, Mich. | 1 mg/l |
| sodium cyanide | 10 mg/l |
| potassium sulfide | 0.8 mg/l |
| 2 mercaptobenzothiazole | 0.08 mg/l |
| formaldehyde (37%) | 20 ml/l |
| sodium hydroxide to pH 13 | |

After electroless copper plating, resist images cutlining the surface conductor patterns were applied, and a 35 micrometer thick copper conductor pattern was electroplated on the exposed areas not covered with resist. An 8 micrometer thick tin-lead etch resist was electroplated over the conductor pattern. The resist images were removed and the portions of the surface foils not covered by the tin-lead were etched away.

The printed circuit produced passed the solder float test at 288° C. The copper deposit in the holes uniformly adhered to the electrophoretically deposited coating. However, insulation resistance between the aluminum core and the copper conductor pattern was low due to the conductivity of the carbon filler in the electrophoretically deposited coating.

EXAMPLE 6

Bare aluminum plaques were coated with the filled resinous coatings of Examples 1 and 5. The plaques were adhesion promoted and coated with electroless copper by the procedures of Examples 1 and 5, respectively. A resist was printed on the electroless copper, and the electroless copper was etched away to leave copper disks 38 mm in diameter on the lacquer surface. The copper disks were insulated from the aluminum substrates by the thickness of the electrophoretically deposited coatings.

The insulation resistance measured between the copper disk and the aluminum substrate was $10^7$ megohms for the filled epoxy resin coating of Example 1 and less than one megohm for the carbon filled epoxy resin coating of example 5. Similarly the dielectric breakdown voltages of the two resinous coatings were measured. The resinous coating of Example 1 failed at 9000 volts; the resin coating of Example 5 failed at 570 volts.

This shows that while a filler may give the resinous coating the necessary adhesion promotable surface, a conductive filler, i.e., carbon, may produce insulation properties too low for practical applications in the printed circuit industry.

EXAMPLE 7

An electrophoretic coating solution was prepared from two separate solutions.
The first solution was:

|  |  |
|---|---|
| deionized water | 7500 ml |
| phosphoric acid | 15.25 ml |
| lactic acid | 41.5 ml |
| resin 5276A | 1188 g |
| resin 5268 | 92.7 g |

The second solution contained the filler:

|  |  |
|---|---|
| deionized water | 100 ml |
| lactic acid | 2.8 ml |
| resin 5268 | 24.2 g |
| surfonyl defoamer | 0.8 g |
| #10 clay | 53 g |
| ethylene glycol monohexyl ether | 25 ml |

The filled electrophoretic coating was formulated by adding these two solutions to one liter of deionized water. This produced a resinous coating with 9% solids containing 1/16 weight fraction of filler.

Epoxy prepregs were laminated to both sides of an aluminum sheet. A butadiene-acrylonitrile rubber and phenolic resin adhesive was laminated to the surfaces and cured. The adhesive layers were adhesion promoted by immersing the panel for 15 minutes in an aqueous solution at 40° C. containing:

|  |  |
|---|---|
| chromium trioxide | 40 g/l |
| sulfuric acid | 300 ml/l |
| sodium fluoride | 30 ml/l |

After neutralization in sodium metabisulfite solutions, the adhesive layers were catalyzed for electroless copper deposition and plated with a copper layer by the plating procedures described in example 1.

Holes were drilled through the laminated panel. The hole walls in the aluminum core were etched back by immersion for twenty minutes in a 20% sodium hydroxide solution at 35° C. The laminated panel was rinsed for 8 minutes, immersed in a 15% hydrochloric acid solution for one minute and rinsed again for one minute.

The panel then was placed in the filled electrophoretic resinous coating solution and the aluminum core connected as the cathode. The holes were plated with the resinous coating at 24° C. with a stepwise increase in plating voltage as follows:

| Plating Voltage: |  |
|---|---|
| 0–30 sec | 0–100 V |
| 30 sec.–2.5 min. | 100 V |
| 2.5 min.–4.5 min. | 125 V |
| 4.5 min.–12.5 min. | 150 V |

After electrophoretically depositing the coating, the panel was rinsed and blown dry with a jet of air. The coating was cured at 175° C. for one hour.

The resinous coating was adhesion promoted by first immersing the panel for five minutes in the mixed sulfuric and phosphoric acid solution of Example 3, and then for five minutes in the oxidizing solution of Example 3.

A printed circuit was produced by the semi-additive technique on the panel. The resinous coating on the hole walls was 0.040–0.045 mm thick. The adhesion of the copper to the hole walls was good.

EXAMPLE 8

An aluminum plaque without surface layers of epoxy prepreg or drilled holes was coated with the resinous coating of Example 7 by the procedures of Example 7. It was adhesion promoted as Example 7 except that the oxidizing solution of Example 1 was used with a five minute immersion.

Copper was electrolessly deposited on the plaque and the resistivity of the copper surface to the aluminum core through the resinous coating was $10^{13}$ ohms.

The bond strength of the copper on the surface of the resinous coating measured by the peel strength test was 0.4–0.7 N/mm.

EXAMPLE 9

Electrophoretic coating solutions are prepared from two separate solutions as in Example 7. In this case, the second solution comprises:

|  |  |
|---|---|
| A. deionized water | 100 ml |
| lactic acid | 2.8 ml |
| resin 5268 | 24.2 g |
| surfonyl defoamer | 0.8 g |
| #20 clay (hydrous aluminum | 53 g |

| silicate clay commercially available from Burgess Pigment Co.) | |
|---|---|
| ethylene glycol monohexyl ether | 25 ml |

This solution demonstrates clay of 0.75 micron particle size.

| B. deionized water | 100 ml |
|---|---|
| lactic acid | 2.8 ml |
| resin 5268 | 24.2 g |
| surfonyl defoamer | 0.8 g |
| #40 clay (hydrous aluminum silicate clay cormmercially available from Burgess Pigment Co.) | 53 g |
| ethylene glycol monohexyl ether | 25 ml |

This solution demonstrates clay of 4.5 micron particle size.

| C. deionized water | 100 ml |
|---|---|
| lactic acid | 2.8 ml |
| resin 5268 | 24.2 g |
| surfonyl defoamer | 0.8 g |
| hydrated amorphous silicate (commercially available as HiSil 233 from PPG Industries, Springdale, PA 15144.) | 53 g |
| ethylene glycol monohexyl ether | 25 ml |

This solution demonstrates hydrated amorphous silica as a filler.

| D. deionized water | 100 ml |
|---|---|
| lactic acid | 2.8 ml |
| resin 5268 | 24.2 g |
| surfonyl defoamer | 0.8 g |
| zirconium silicate | 53 g |
| ethylene glycol monohexyl ether | 25 ml |

This solution uses zirconium silicate as a filler.

| E. deionized water | 100 ml |
|---|---|
| lactic acid | 2.8 ml |
| resin 5268 | 24.2 g |
| surfonyl defoamer | 0.8 g |
| fine particle talc (commercially available as CP 1040 talc from Pfeizer Inc., Chemical Div., 235 E. 42nd St., NY, 10017) | 53 g |
| ethylene glycol monohexyl ether | 25 ml |

This solution uses talc of fine particle size, as a filler.

| F. deionized water | 100 ml |
|---|---|
| lactic acid | 2.8 ml |
| resin 5628 | 24.2 g |
| surfonyl defoamer | 0.8 g |
| carbon black (commercially available as Mogul Black from Cabot Corp., P.O. Box 188 Tuscola, Ill. 61953) | 16 g |
| #10 clay (hydrous aluminum silicate clay commercially available from Burgess Pigment Co.) | 37 g |
| ethylene glycol monohexyl ether | 25 ml |

Each of these solutions then is mixed with the first solution and deionized water (as per Example 7) to form 9% solid, 1/16 filler ratio electrophoretic coating solutions with varying fillers.

Test boards are prepared, coatings applied, and adhesion promoted, as per Example 7. They then are electrolessly plated as per Example 1, resulting in smooth, faultless, blister-free deposits which are not removed by mild abrasion.

The invention in its broadest aspects is not limited to the specific steps, methods, compositions and improvements shown and described therein, but departures may be made within the scope without departing from the principles of the invention.

What is claimed is:

1. In a process for producing a printed circuit on an insulated metal substrate, which process includes providing one or more insulating layers on surfaces of a metal sheet to form the insulated metal substrate; providing one or more holes through the insulated substrate for through connections; etching the hole walls defined by the metal sheet to enlarge by a predetermined amount only the portion of the holes extending through the metal sheet, electrophoretically depositing a resinous coating comprising a cathodic or anodic electrophoretic thermosetting resin from a solution thereof on the etched portion of the hole walls; curing the resinous coating; and forming the printed circuit on the surface of the insulating layers and on the walls of the holes; the improvement comprising:

incorporating in the resin solution a solid filler in finely divided form and having an average particle size of about 1 micron or less, the filler being non-resinous, inorganic, non-reactive with the solution and uniformly dispersed therethrough, the filler being capable of improving the adhesion of a metal layer to the electrophoretically deposited resinous coating after the coating is adhesion promoted, the resinous coating containing the filler having a volume resistivity greater than $10^4$ megohm-cm between the printed circuit conductor and the metal sheet;

electrophoretically depositing the resinous coating and the filler from the solution onto the metal wall portions of the holes, the deposited coating having fillers dispersed therethrough;

curing the resinous coating, the thickness of the cured resinous coating being between about 0.025 mm and about 0.055 mm, the cured resinous coating being comprised of (a) 1% to 25% by weight of said filler, and (b) the balance being said thermosetting resin;

adhesion promoting the surface of the resinous coating containing the filler to create a hydrophilic, microetched surface on the coating;

depositing a metal layer on the surface of the resinous coating on the hole walls, and on the insulating layers, the metal layer deposited on the microetched surface of the resinous coating being continuous and free of blisters, and forming said printed circuit on the insulated metal substrate.

2. A process as defined in claim 1, wherein the solid filler is selected from the group consisting of clays, silicas, aluminas, silicates, earths, barium sulfide, zinc oxide and titanium dioxide.

3. A process as defined in claim 1, wherein the adhesion promotion is accomplished by oxidation.

4. A process as defined in claim 3, wherein the oxidation is accomplished by an aqueous oxidizing solution.

5. A process as defined in claim 1, wherein the adhesion promotion is accomplished with a hexavalent chromium solution.

6. A process as defined in claim 1, wherein the adhesion promotion is accomplished with a first acid solution and a second oxidizing solution, said second oxidizing solution comprising hexavalent chromium.

7. A process as defined in claim 1 wherein the metal layer deposited on the microetched surface of the resinous coating passes a tape test.

8. A process as defined in claim 1, wherein the metal layer deposited on the microetched surface of the resinous coating adheres to the coating with a peel strength of at least about 0.1 N/mm.

9. In a process for producing a printed circuit on an insulated metal substrate comprised of a metal sheet with insulating surface layers in which the substrate is provided with holes for through connections, the portions of hole walls extending through the metal sheet are enlarged by a predetermined amount and metal wall portions of the holes are insulated with a resinous coating electrophoretically deposited from a solution thereof, the solution comprising an anodic or cathodic electrophoretic epoxy resin, the improvement comprising:

incorporating in the resin solution a solid filler in particulate form, the average particle size of which is finer than about 1 micron in diameter, said filler being non-resinous, inorganic, non-reactive with the solution and uniformly dispersed therethrough, the filler being capable of improving the adhesion of a metal layer to the electrophoretically deposited resinous coating after the coating is adhesion promoted, the filler being selected from the group consisting of clays, aluminas, silicates, earths, barium sulfate, zinc oxide and titanium dioxide, the resinous coating containing the filler having a volume restivity greater than $10^4$ megohm-cm between the printed circuit conductor and the metal sheet;

electrophoretically depositing the resinous coating and filler from the solution onto the metal wall portions of the holes, the deposited coating having filler uniformly dispersed therethrough;

curing the resinous coating, the thickness of the coating after curing being between about 0.025 mm and about 0.055 mm, the cured resinous coating being comprised of 1 to 25% by weight of said filler, the balance being said epoxy resin;

adhesion promoting the surface of the resinous coating with an aqueous oxidizing solution to create a hydrophilic, microetched surface on the coating;

depositing a metal layer on the surface of the resinous coating on the hole walls, and on the insulating surface layers, the metal layer deposited on the microetched surface of the resinous coating being continuous and free of blisters, and forming said printed circuit on the insulated metal substrate.

10. A process for depositing an adherent metallic film on at least part of a surface of a metal substrate coated with an electrophoretically deposited resinous coating, the resinous coating including a anodic or cathodic electrophoretic thermosetting resin, the process comprising:

(a) incorporating in the resinous coating a filler in finely divided form selected from the group consisting of clays, alumina, silica, silicates, earths, barium sulfate, zinc oxide and titanium dioxide;

(b) electrophoretically depositing the resinous coating onto the surface of a metal substrate;

(c) curing said resinous coating, the cured resinous coating being comprised of 1% to 25% by weight of said filler, the balance being said thermosetting resin;

(d) adhesion promoting the surface of said resinous coating to expose some of the filler and to create a microporous, hydrophilic surface on at least part of the coating, wherein the adhesion promotion is accomplished with a first acid solution followed by a second oxidizing solution, said second oxidizing solution comprising hexavalent chromium; and (e) electrolessly depositing an adherent metallic film on the part of the surface which has been adhesion promoted, the metal film deposited being continuous, free of blisters and adhering to the resinous coating when tested with a pressure-sensitive tape.

11. A process as defined in claim 10, wherein the hexavalent chromium compound is chromium trioxide.

12. A process as defined in claim 11, wherein the aqueous solution of chromium trioxide comprises 400–900 g/l.

13. A process as defined in claim 2 wherein said filler is a clay.

14. A process as defined in claim 13 wherein said clay is a hydrous aluminum silicate clay with an average particle size of 0.5 micrometers.

15. A process as defined in claim 10, wherein said filler is a clay.

16. A process as defined in claim 15, wherein said clay is a hydrous aluminum silicate clay with an average particle size of 0.5 micrometers.

* * * * *

UNITED STATES PATENT AND TRADEMARK OFFICE
CERTIFICATE OF CORRECTION

PATENT NO. : 4,601,916

DATED : July 22, 1986

INVENTOR(S) : James J. Arachtingi

It is certified that error appears in the above-identified patent and that said Letters Patent is hereby corrected as shown below:

Column 13, line 43, add a fourth footnote as follows:

****A hydrous aluminum silicate clay with an average particle size of 0.5 micrometers, commercially available from Burgess Pigment Co., Sanderville, Ga as #10 Clay.

Signed and Sealed this

Tenth Day of February, 1987

Attest:

DONALD J. QUIGG

Attesting Officer

Commissioner of Patents and Trademarks